United States Patent
Jayaraman et al.

(10) Patent No.: US 9,325,287 B2
(45) Date of Patent: Apr. 26, 2016

(54) PROGRAMMABLE GAIN AMPLIFIER WITH CONTROLLED GAIN STEPS

(71) Applicant: APPLIED MICRO CIRCUITS CORPORATION, Sunnyvale, CA (US)

(72) Inventors: Nanda Govind Jayaraman, Santa Clara, CA (US); Tarun Gupta, Santa Clara, CA (US)

(73) Assignee: APPLIED MICRO CIRCUITS CORPORATION, Santa Clara, CA (US)

( * ) Notice: Subject to any disclaimer, the term of this patent is extended or adjusted under 35 U.S.C. 154(b) by 71 days.

(21) Appl. No.: 14/162,896

(22) Filed: Jan. 24, 2014

(65) Prior Publication Data

US 2015/0326197 A1  Nov. 12, 2015

(51) Int. Cl.
*H03F 3/45* (2006.01)
*H03G 3/30* (2006.01)

(52) U.S. Cl.
CPC ...................................... *H03G 3/30* (2013.01)

(58) Field of Classification Search
CPC .......................................................... H03F 3/45
USPC ........................... 300/253, 254, 260, 261, 278
See application file for complete search history.

(56) References Cited

U.S. PATENT DOCUMENTS

| 7,417,500 B2* | 8/2008 | Arnott | 330/86 |
| 7,889,006 B1* | 2/2011 | Jones | 330/254 |

* cited by examiner

*Primary Examiner* — Khanh V. Nguyen
*Assistant Examiner* — Khiem Nguyen
(74) *Attorney, Agent, or Firm* — Amin, Turocy & Watson LLP; Gregory Turocy (57) ABSTRACT

Provided is a programmable gain amplifier that includes controlled gain steps that dynamically control an output voltage in real-time. The programmable gain amplifier includes a first transistor and a second transistor that includes respective control ports, input ports, and output ports. The programmable gain amplifier also includes a resistor connected to the output ports of the transistors. Further, at least a third transistor is connected to the output ports, in parallel with the resistor. On applying a control voltage to the third transistor and applying an input voltage to the first control port, the second control port is selectively modified by the control voltage to produce a desired output at the first input port and the second input port.

20 Claims, 9 Drawing Sheets

PROGRAMMABLE GAIN AMPLIFIER WITH CONTROLLED GAIN STEPS

TECHNICAL FIELD

The subject disclosure relates generally to electronic circuits and, also generally, to a programmable gain amplifier with controlled gain steps.

BACKGROUND

In electronic circuits, a programmable gain amplifier is an electronic amplifier that has a gain on its output signal that can be controlled by an external digital signal or an external analog signal. The realized gain of the programmable gain amplifier can differ from the intended gain due to process variations, voltage variations, and/or temperature variations. Therefore, it can be difficult to design a programmable gain amplifier that operates as intended over a multitude of operating conditions.

Since the various variations are not known to the external device(s) that control the gain of the programmable gain amplifier, attempts to control the gain have to be made without knowledge of the variations that are experienced by the programmable gain amplifier. Therefore, in an attempt to compensate for the various variations, a programmable gain amplifier is usually overdesigned in order to function satisfactorily over as many variation considerations as possible. This overdesign can include finer gain steps and a larger range of gain programmability. Further, such overdesign of programmable gain amplifiers can result in larger components and/or more components, which has a corresponding increased power consumption due to the overdesign as well as a larger footprint (e.g., a larger device).

The above-described deficiencies of conventional approaches to electronic circuits and programmable gain amplifier design are merely intended to provide an overview of some of the problems of conventional approaches and techniques, and are not intended to be exhaustive. Other problems with conventional circuits and techniques, and corresponding benefits of the various non-limiting embodiments described herein may become further apparent upon review of the following description.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

An aspect relates to a programmable gain amplifier that includes a first transistor comprising a first control port, a first input port, and a first output port. The programmable gain amplifier also includes a second transistor comprising a second control port, a second input port, and a second output port. Also included is a resistor comprising a first end connected to the first output port and a second end connected to the second output port. Further, the programmable gain amplifier includes at least a third transistor connected to the first output port and the second output port, in parallel with the resistor. On applying a control voltage to the third transistor, and applying an input voltage to the first control port, the second control port is selectively modified by the control voltage to produce a desired output at the first input port and the second input port.

Another aspect relates to an integrated circuit that includes an amplifier for producing an output signal at an amplifier output based on an input signal received at an amplifier input. The amplifier includes a first transistor comprising a first control port, a first input port, and a first output port and a second transistor comprising a second control port, a second input port, and a second output port. The first control port and the second control port comprise the amplifier input and the first input port and the second input port comprise the amplifier output. The amplifier also includes a first switch connected to the first output port and the second output port. A control voltage applied to the first switch selectively controls an output of the amplifier. The control voltage is supplied by a feedback circuit that includes a replica amplifier configured as a scaled version of the amplifier. The feedback circuit also includes a difference amplifier configured to determine a value representing a difference between an output voltage of the replica amplifier and a pre-determined output voltage. An output of the difference amplifier comprises the control voltage.

A further aspect relates to a method of processing an input signal to an output signal. The method includes receiving an input voltage across two transistors, wherein respective input ports of the two transistors are connected to a supply voltage through respective load resistors. The method also includes supplying a control voltage to at least one switch connected to output ports of the two transistors, wherein the control voltage is supplied by a feedback circuit. Further, the method includes directing current flow through the respective load resistors based on the input signal and the control voltage to form the output signal at the input ports of the two transistors.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Various non-limiting embodiments are further described with reference to the accompanying drawings in which.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the disclosure, as generally described herein, and illustrated in the Figures, can be arranged, substituted, combined, separated, and designed in a wide variety of different configurations, all of which are explicitly contemplated herein.

To increase the effectiveness of amplifier design, the disclosed aspects provide an amplifier that has multiple gain steps. The gain of the amplifier at each of these steps can be controlled by means of a feedback loop, which can set the degeneration resistance of the amplifier dynamically.

The programmable gain amplifier, as disclosed herein, has a built-in feedback circuit that measures and fine-tunes the circuit until the intended gain is achieved. This measuring and fine-tuning is achieved in real-time, or near real time. Further, the measurements and fine-tuning is performed internally, such that actual variations experienced by the circuit are considered. The disclosed aspects, therefore, reduce the need to over-design the programmable gain amplifier. The disclosed aspects also conserve power and area by decreasing a size and complexity of the programmable gain amplifier 100.

Figure 1:
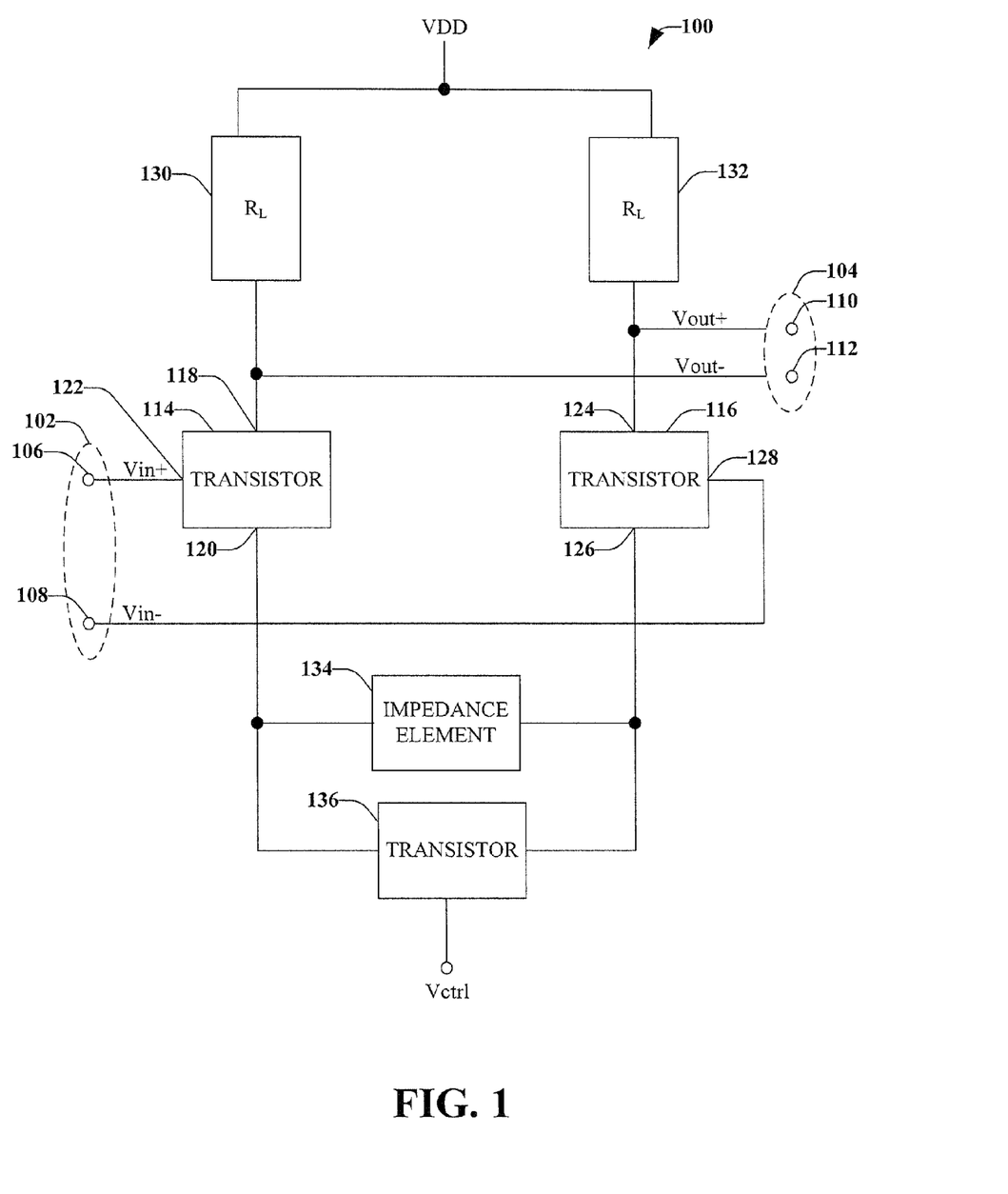
FIG. 1 illustrates a block diagram of a programmable gain amplifier, according to an aspect.

FIG. 1 illustrates a block diagram of a programmable gain amplifier 100, according to an aspect. The programmable gain amplifier 100 as disclosed herein is configured to amplify a received signal by the correct amount in order for subsequent states of a circuit to see the same amplitude of the signal, regardless of the process variations, voltage variations, temperature variations, and/or other variations experienced by the programmable gain amplifier.

The programmable gain amplifier 100 can be implemented using discrete components. In accordance with some aspects, the programmable gain amplifier 100 can be implemented in an integrated circuit. In further aspects, the programmable gain amplifier 100 can be implemented in any combination of integrated circuits and discrete components formed in accordance with a single manufacturing technique or a combination of manufacturing techniques.

The programmable gain amplifier 100 amplifies an input signal received across an amplifier input 102 to produce an output signal at an amplifier output 104. The amplifier input 102 comprises a Vin+ port 106 and a Vin− port 108. The amplifier output 104 comprises a Vout+ port 110 and a Vout− port 112.

Included in the programmable gain amplifier 100 are a first transistor 114 and a second transistor 116. The first transistor 114 comprises an input port 118, an output port 120, and a control port 122. The second transistor 116 comprises an input port 124, an output port 126, and a control port 128.

The input ports 118 and 124 are connected to a supply voltage VDD through respective load resistors 130 and 132. The output ports 120 and 126 are connected to a control voltage Vctrl. The control voltage Vctrl is produced by a circuit that includes a programmable gain amplifier, which is a scaled replica of the programmable gain amplifier 100. The circuit that produces the control voltage Vctrl also includes a difference amplifier that is configured to determine a difference between an output voltage of the scaled replica programmable gain amplifier and a desired output voltage. A value representative of the difference is fed back to the scaled replica programmable gain amplifier (e.g., through a feedback circuit or feedback loop) and an incremental adjustment to an input voltage of the scaled replica programmable gain amplifier is applied.

For example, if the value representative of the difference indicates the output of the replica programmable gain amplifier is too low, the input voltage of the replica programmable gain amplifier can be increased by an expansion unit for at least one iteration. In another example, if the value representative of the difference indicates the output of the replica programmable gain amplifier is too high, the input voltage of the replica programmable gain amplifier can be decreased by a reduction unit for at least one iteration. The expansion unit and the reduction unit can be respective increases and/or decreases in an input voltage value, wherein the input voltage is scaled appropriately for the replica programmable gain amplifier. Further, the expansion unit and the reduction unit can be similar units (e.g., voltages); however, according to some implementations the expansion unit and the reduction units are different units.

The incremental adjustments are applied in stages or steps for a number of iterations until the output of the scaled replica programmable gain amplifier is determined to be approximately the same as the desired value. Further information related to this feedback circuit (e.g., feedback loop) will be provided below with reference to FIG. 2.

An impedance element 134 is connected between the output ports 120 and 126. According to an implementation, the impedance element 134 can be a resistor; however, other types of impedance elements can be utilized with the disclosed aspects. Further, a third transistor 136 is connected between the two output ports 120 and 126, in parallel with the impedance element 134. According to some implementations further transistors (e.g., a fourth transistor, a fifth transistor, and so forth) can be connected between the output ports 120 and 126 and ground. The third and subsequent transistors are configured to provide the multiple gain steps in order to selectively regulate the output voltage. Further information related to the internal feedback loop will be described below.

According to some aspects, an impedance element 134 is not connected between the two output ports 120 and 126. For example, source degeneration can be achieved using switches, such as a metal-oxide-semiconductor (MOS) switch, for example. The source degeneration is the deliberate reduction of the gain of an amplifier with the intent of making the amplifier more controlled and linear.

During operation of the programmable gain amplifier 100, current flows through the first transistor 114 and the second transistor 116 in accordance with the voltage levels at the amplifier input 102. Further, current flows through the load resistors 130 and 132 and the output signal is produced at the amplifier output 104.

It is noted that although the programmable gain amplifier of the various aspects disclosed herein might be illustrated and described as implemented with field effect transistors within an integrated circuit, the disclosed aspects are not limited to this implementation. Instead, the programmable gain amplifier can be implemented with other types of transistors. For example, it is noted that although exemplary embodiments might be described with reference to transistors that are Complementary Metal Oxide Semiconductor (CMOS) Field Effect Transistors (FETs), the disclosed aspects are not limited to this implementation. Instead, the transistors can be any type of transistor or semiconductor technology.

According to one exemplary implementation, the first transistor 114 and the second transistor 116 can be FETs. Further to this implementation, the input ports 118 and 124 can correspond to respective drains of the FETs, the output ports 120 and 126 can correspond to respective gates of the FETs, and the control ports 122 and 128 can correspond to respective sources of the FETs.

According to another exemplary implementation, the first transistor 114 and the second transistor 116 can be bipolar junction transistors (BJTs). Further to this implementation, the input ports 118 and 124 can correspond to respective collectors of the BJTs, the output ports 120 and 126 can correspond to respective bases of the BJTs, and the control ports 122 and 128 can correspond to respective emitters of the BJTs.

Further, the programmable gain amplifier can be used for a variety of circuits. According to some implementations, two or more programmable gain amplifiers can be connected to form an amplifier with a higher overall gain.

According to an implementation, the disclosed aspects can be used in a receiver end of a data transmission channel as part of the programmable gain amplifier. The purpose of the programmable gain amplifier in this implementation is to amplify the signal coming in over the transmission channel by the correct amount so that the subsequent stages of the receiver always see the same amplitude of the signal, irrespective of how much the signal amplitude was when it reached the receiver.

In accordance with other implementations, the disclosed aspects can be used in any generic amplifier where the gain can be accurately controlled by means of a feedback loop, as discussed herein. A generic amplifier can be an ubiquitous component of an analog circuitry, therefore two or more programmable gain amplifiers, as discussed herein, can be utilized in a circuit comprising generic amplifiers.

Figure 2:
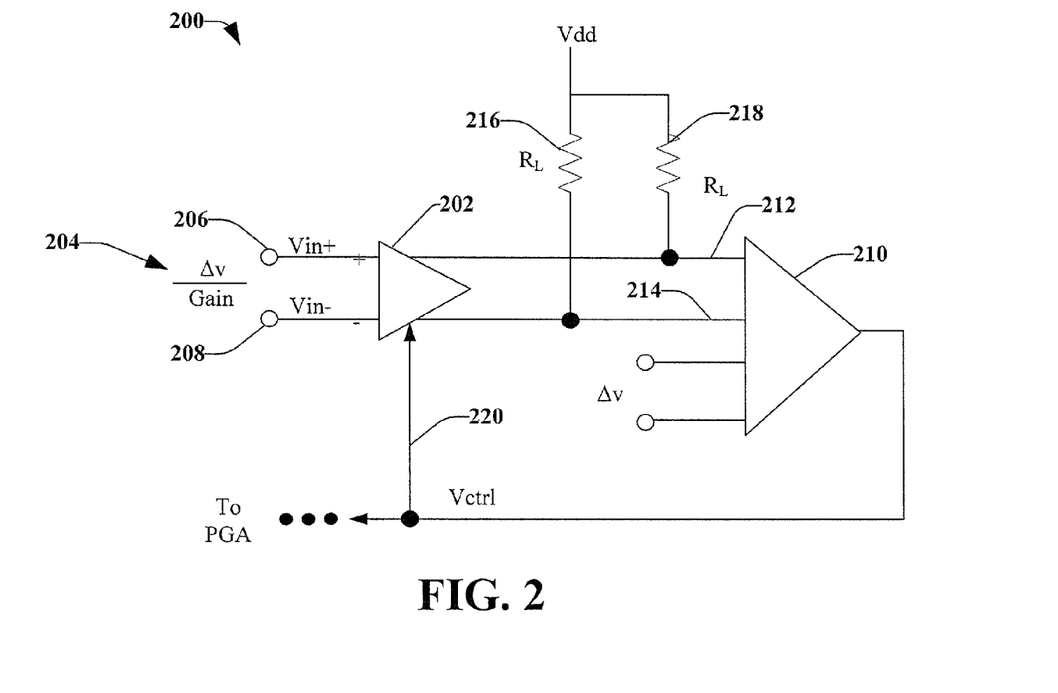
FIG. 2 illustrates a schematic representation of a circuit that comprises a feedback loop that controls a gain of a programmable gain amplifier through incremental steps, according to an aspect.

FIG. 2 illustrates a schematic representation 200 of a circuit that comprises a feedback loop that controls a gain of a programmable gain amplifier through incremental steps, according to an aspect. Controlling the gain of a programmable gain amplifier can include setting the degeneration resistance to a predetermined value. However, this control is generally not accurate because the gain of the programmable gain amplifier is dependent on a multitude of other factors apart from the degeneration resistance. Further, each of the multitude of other factors can exhibit wide and random process, voltage, and/or temperature variations.

The disclosed aspects can accurately control the gain of the programmable gain amplifier by using a scaled replica (which can be an exact scaled replica) of the programmable gain amplifier. The disclosed aspects also directly set the gain of the replica programmable gain amplifier to the desired or required gain. Further, settings that are similar to settings applied to the replica programmable gain amplifier are applied to the original programmable gain amplifier (e.g., programmable gain amplifier 100 of FIG. 1), wherein "original" refers to the un-scaled programmable gain amplifier that is being controlled. In this manner, the disclosed aspects can account for the process, voltage, and/or temperature variations in the gain of the programmable gain amplifier.

As illustrated in FIG. 2, a replica programmable gain amplifier 202 comprises a scaled version of an original programmable gain amplifier (e.g., programmable gain amplifier 100 of FIG. 1). The replica programmable gain amplifier can be scaled to any size of the original programmable gain amplifier. The size can be selected to provide an accurate model of the variations that are experienced by the original programmable gain amplifier while also being small enough to not have an impact on the overall size of the device and/or integrated circuit.

The replica programmable gain amplifier 202 receives a direct current (DC) input voltage 204 (e.g., Vin) at respective input ports, namely, a Vin+ port 206 and a Vin− port 208. The DC input voltage 204 can be equal to a pre-determined voltage (e.g., delta voltage or $\Delta v$) divided by the required gain of the programmable gain amplifier ($\Delta v$/GAIN).

Also included is a difference amplifier 210. A difference amplifier is a special purpose amplifier that is configured to measure differential signals and can also be referred to as a subtractor. For example, the difference amplifier 210 can sample the output voltage at a particular point in time. The difference amplifier 210, according to an implementation, can be a low bandwidth (e.g., low power) but high gain amplifier that adjusts a control voltage Vctrl to make the gain of the replica programmable gain amplifier 202 equal to an intended gain.

The output of the replica programmable gain amplifier 202 is compared against a similar DC voltage ($\Delta v$) by the difference amplifier 210. Further, input ports 212 and 214 of the difference amplifier 210 are connected to a supply voltage (VDD) through respective load resistors 216, 218. The input ports 212 and 214 also receive an output of the replica programmable gain amplifier 202.

According to a non-limiting example, the predetermined voltage ($\Delta v$) can be 100 mV. Further to this example, the output of the replica programmable gain amplifier 202 is compared against a 100 mV DC voltage by the difference amplifier 210. It is noted that other values of the predetermined voltage and comparison voltage can be utilized with the disclosed aspects and 100 mV is utilized for example purposes only.

The output of the difference amplifier 210 is fed to the actual programmable gain amplifier (e.g., programmable gain amplifier 100), such as at the third transistor 136 of FIG. 1. The output of the difference amplifier 210 is also supplied to the replica programmable gain amplifier 202 through a feedback loop 220.

If the output of the replica programmable gain amplifier 202 does not match the desired output, as determined by the difference amplifier 210, an adjustment is made to the input voltage of the replica programmable gain amplifier 202 in incremental steps (e.g., an expansion unit, a reduction unit).

For example, if the output of the replica programmable gain amplifier 202 is lower than desired, the input voltage to the replica programmable gain amplifier 202 can be increased by a first incremental value (e.g., an expansion unit) for a first iteration. The first iteration can be a first time unit, according to an implementation. After the input voltage is increased, the difference amplifier 210 compares the new output value of the replica programmable gain amplifier 202 to the desired value. If the output value is still too low, the input voltage to the replica programmable gain amplifier 202 is adjusted upward by a second incremental value for a second iteration. This process is repeated until the output of the replica programmable gain amplifier 202 is about the same as the desired output.

In an example, the second incremental value is twice the first incremental value. In a further example, a third incremental value is the second incremental value plus the first incremental value. Continuing this example, a fourth incremental value is the third incremental value plus the first incremental value. For example, if the first incremental value is 0.1 volt, the second incremental value is 0.2 volt, the third incremental value is 0.3 volt, the fourth incremental value is 0.4 volt, and so on. In another example, if the first incremental value is 0.15 volt, the second incremental value is 0.30 volt, the third incremental value is 0.45 volt, and so on.

In accordance with another example, if the output of the replica programmable gain amplifier 202 is higher than the desired output, the information is fed back from the difference amplifier 210 to the replica programmable gain amplifier 202 through the feedback loop 220. In this instance, the input voltage is decreased by a first incremental value (e.g., a reduction unit) for a first iteration. After the input voltage is decreased, the output voltage of the replica programmable gain amplifier 202 is again compared to the desired output. If the output voltage is still too high, an adjustment is made to the input voltage to reduce the input voltage by a second incremental value for a second iteration. This process is repeated until the output of the replica programmable gain amplifier 202 is about the same as the desired output.

In an example, the second incremental value is twice the first incremental value. In a further example, a third incremental value is the second incremental value plus the first incremental value. Continuing this example, a fourth incremental value is the third incremental value plus the first incremental value. For example, if the first incremental value is −0.1 volt, the second incremental value is −0.2 volt, the third incremental value is −0.3 volt, and so on.

According to an example, the expansion unit used for increasing the input voltage is the same as the reduction unit used for decreasing the voltage. For example, if the first expansion unit is 0.12 volts, then the first reduction unit is −0.12 volts.

The disclosed aspects are not limited to the same value being used for the expansion unit and the reduction unit, however. Further, the disclosed aspects are not limited to the same expansion unit and/or the same reduction unit being utilized per iteration. Instead, different units can be utilized.

In an example, if the input voltage to the replica programmable gain amplifier is being increased in order to obtain the desired output, on a last iteration, the increase might be too high. Further to this example, the voltage was increased by a factor of 0.3 volts per iteration. On a last iteration, a voltage of 0.9 volts was applied. However, the output voltage is higher than the desired output voltage. Therefore, on a next iteration, the voltage can be reduced by 0.1 volts and 0.89 volts can be applied. If the output voltage is still too high, on a subsequent iteration the voltage can be reduced by the same amount (0.1 volts) or a different amount (0.2 volts, 0.35 volts, and so on). Therefore, an amount of a next iteration reduction unit (or expansion unit) can be selectively adjusted based on the change in the output voltage between iterations.

Figure 3:
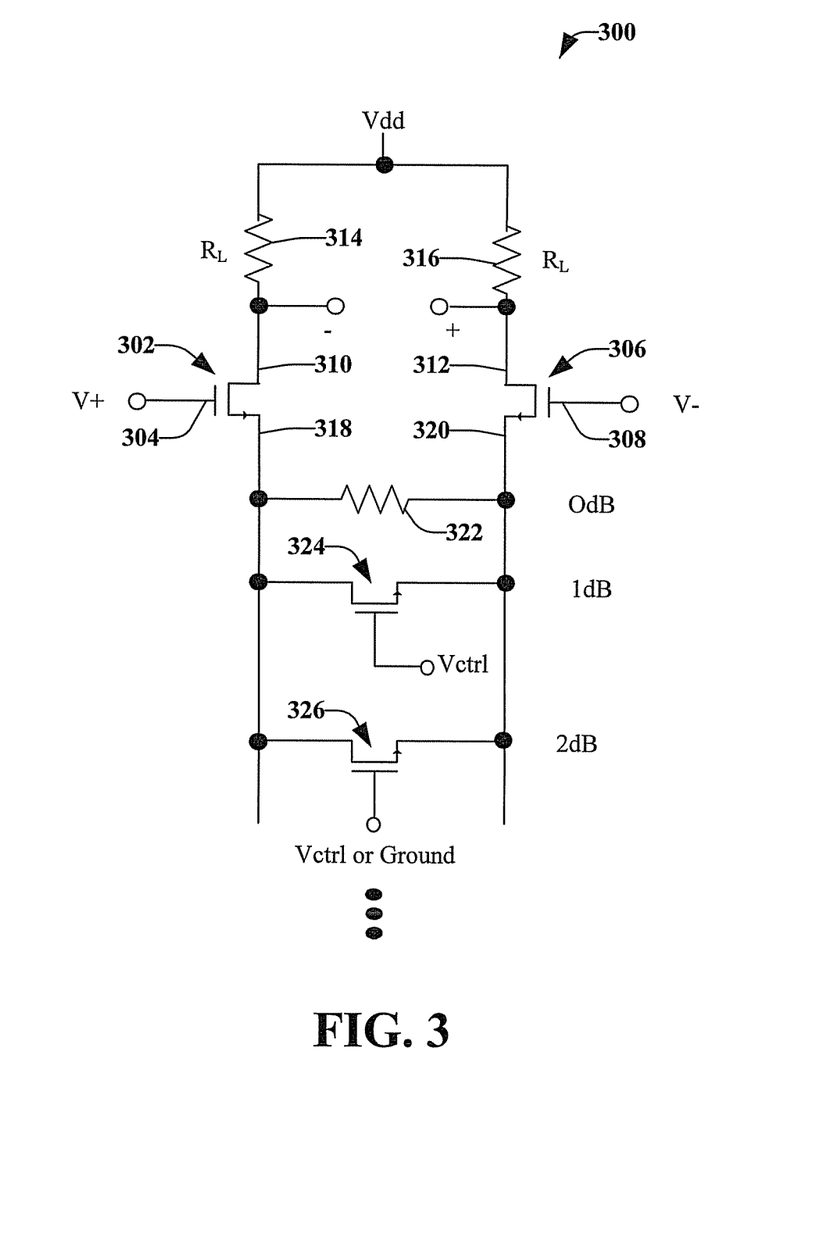
FIG. 3 illustrates a schematic representation of a programmable gain amplifier, according to an aspect.

FIG. 3 illustrates a schematic representation of a programmable gain amplifier 300, according to an aspect. The programmable gain amplifier 300 amplifies an input signal to produce an output signal. A first transistor 302 comprises a control port 304 that receives input signal Vin+ and a second transistor 306 comprises a control port 308 that receives an input signal Vin−.

An input port 310 of the first transistor 302 and an input port 312 of the second transistor 306 are connected to a supply voltage (VDD) through respective load resistors 314 and 316.

Further, an output port 318 of the first transistor 302 and an output port 320 of the second transistor 306 are connected to a control voltage (Vctrl). As discussed with respect to FIG. 2, the control voltage Vctrl is produced by a circuit that includes a scaled replica programmable gain amplifier and a difference amplifier. A value representing a difference between an output of the scaled replica programmable gain amplifier and a desired output is determined and feedback to the scaled replica programmable gain amplifier.

As illustrated in FIG. 3, an impedance element, such as a resistor 322 can be connected between the output ports 318 and 320. However, according to some aspects, the resistor 322 is not included. A third transistor 324 is connected in parallel with the resistor 322 (if provided) and supplies the control voltage Vctrl. Further, a fourth transistor 326 can be connected in parallel with the third transistor 324. Subsequent transistors (not illustrated) can be included in the circuit and are connected in parallel with the third transistor 324 and fourth transistor 326.

According to an example, the degeneration resistance of the circuit of FIG. 3 is set so that gain is 1 dB. While the 1 dB switch is connected to a control voltage Vctrl, the 2 dB and subsequent switches are turned off.

Figure 4:
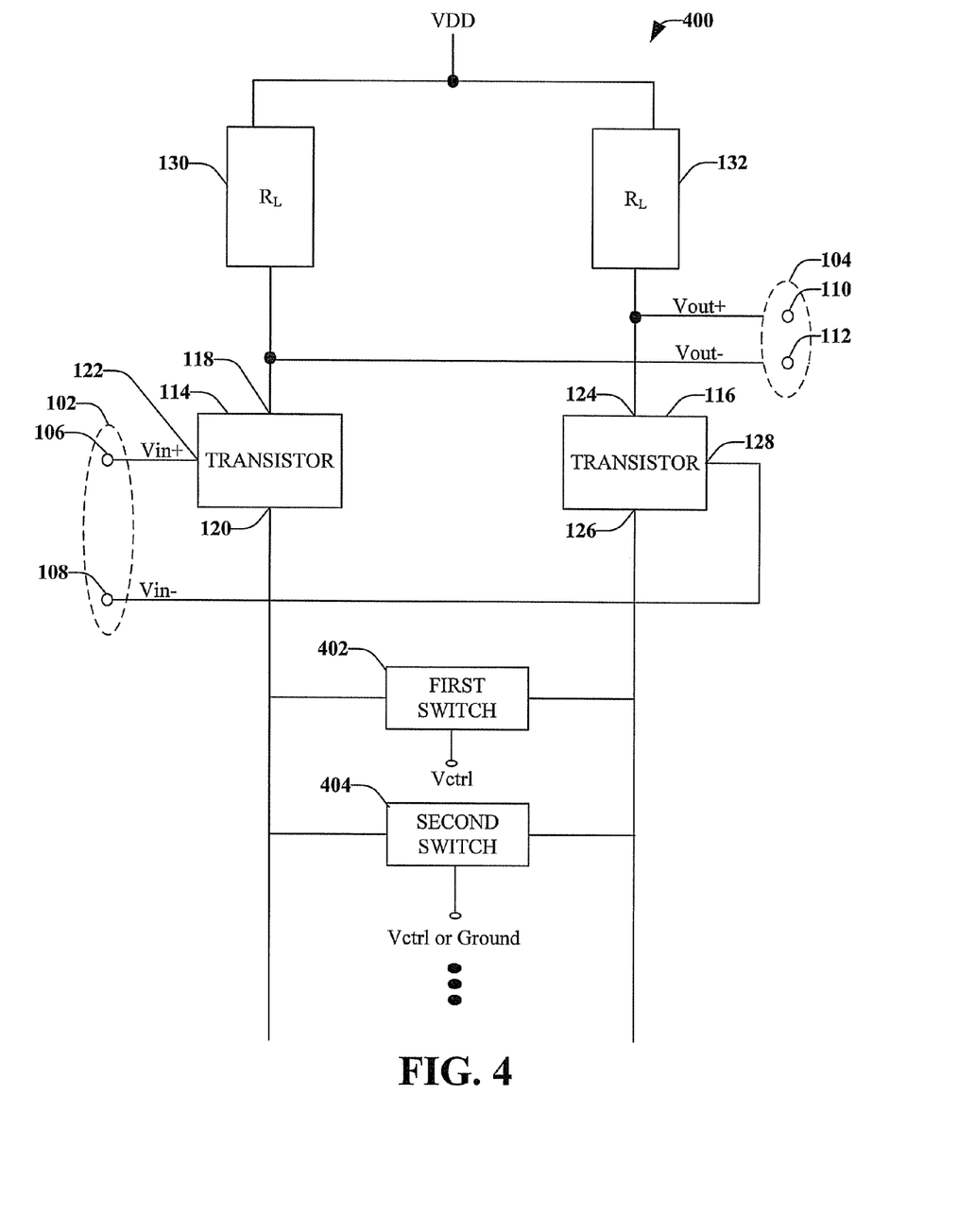
FIG. 4 illustrates an example, non-limiting schematic representation of an alternative embodiment of a programmable gain amplifier.

As mentioned, the resistor 322 (or other impedance element) might not be connected between the two output ports 318 and 320. FIG. 4 illustrates an example, non-limiting schematic representation of an alternative embodiment of a programmable gain amplifier 400. For purposes of simplicity, the same element numbers as the elements of FIG. 1 are utilized. For the programmable gain amplifier 400, source degeneration can be achieved using switches, illustrated as first switch 402 and second switch 404. Additional switches can also be utilized, depending on the number of steps desired to be utilized for fine-tuning the gain of the programmable gain amplifier 400. In an implementation, the first switch 402 and second switch 404 can be metal-oxide-semiconductor (MOS) switches, for example. However, other types of switches can be utilized with the disclosed aspects.

The source degeneration is the deliberate reduction of the gain of an amplifier with the intent of making the amplifier more controlled and linear. If switches are not utilized and connected in parallel, as discussed, the distortion and non-linearity of the programmable gain amplifier 400 would be too high for practical use. The distortion and non-linearity relates to a system that generates an output that is not an exact scaled replica of the input signal. Such a system is referred to as a non-linear system. In the non-linear system, the output signal is said to be distorted with respect to the input signal.

In view of the example circuits shown and described herein, methods that may be implemented in accordance with the one or more of the disclosed aspects, will be better understood with reference to the following flow charts. While, for purposes of simplicity of explanation, the methods are shown and described as a series of blocks, it is to be understood that the disclosed aspects are not limited by the number or order of blocks, as some blocks may occur in different orders and/or at substantially the same time with other blocks from what is depicted and described herein. Moreover, not all illustrated blocks may be required to implement the methods described hereinafter. It is noted that the functionality associated with the blocks may be implemented by software, hardware, a combination thereof or any other suitable means (e.g. device, system, process, component). Additionally, it is also noted that the methods disclosed hereinafter and throughout this specification are capable of being stored on an article of manufacture to facilitate transporting and transferring such methodologies to various devices. Those skilled in the art will understand that a method could alternatively be represented as a series of interrelated states or events, such as in a state diagram. The various methods disclosed herein can be performed by a system comprising at least one processor.

Figure 5:
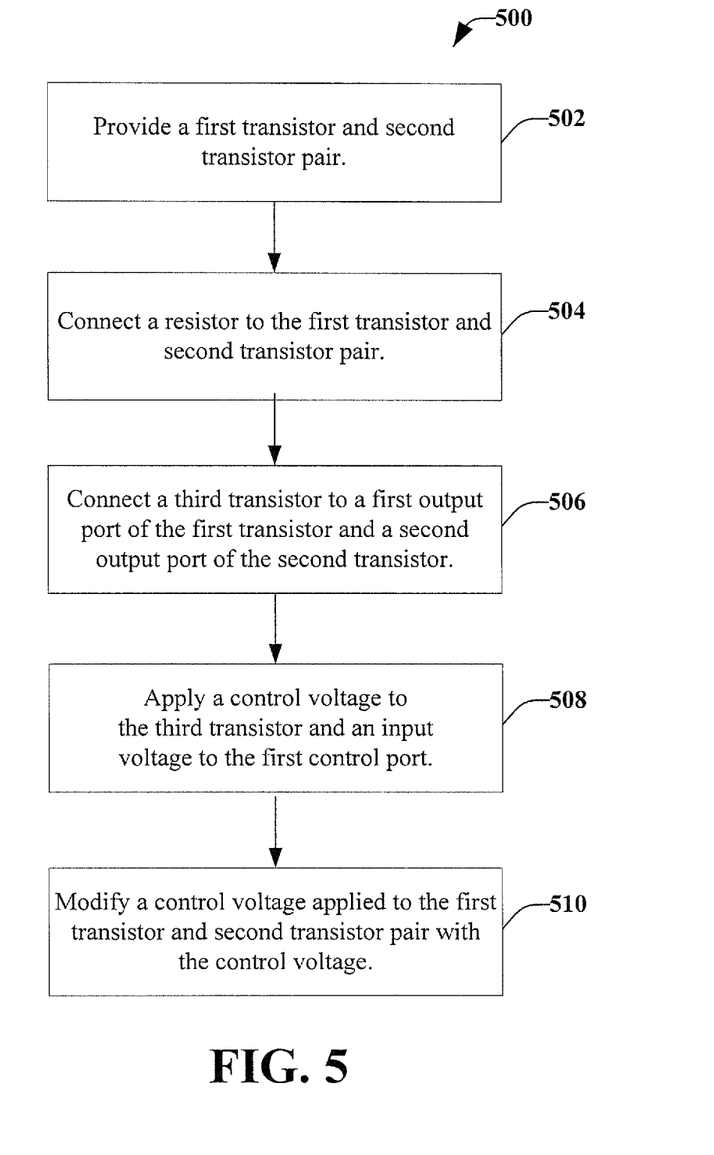
FIG. 5 illustrates an example, non-limiting method for amplifying an input signal, according to an aspect.

FIG. 5 illustrates an example, non-limiting method 500 for amplifying an input signal, according to an aspect. Method 500 starts, at 502, when a first transistor and a second transistor pair are provided. The first transistor can include a first control port, a first input port, and a first output port. The second transistor can include a second control port, a second input port, and a second output port.

At 504, a resistor is connected to the first transistor and second transistor pair. For example, a first end of the resistor is connected to the first output end and a second end of the resistor is connected to the second output port. At 506, a third transistor is connected to the first transistor and second transistor pair. For example, the third transistor is connected to the first output port and the second output port. The third transistor is connected in parallel with the resistor.

On applying a control voltage to the third transistor, at 508, and an input voltage to the first control port, the second control port is selectively modified, at 510, by the control voltage to produce a desired output at the first input port and the second input port.

According to an implementation, the input voltage can be selectively modified based on a closed loop feedback circuit that comprises a scaled replica of a programmable gain amplifier. According to some implementations, an impedance device can be connected to the first output port and the second output port and parallel to the third transistor (and subsequent transistors).

Figure 6:
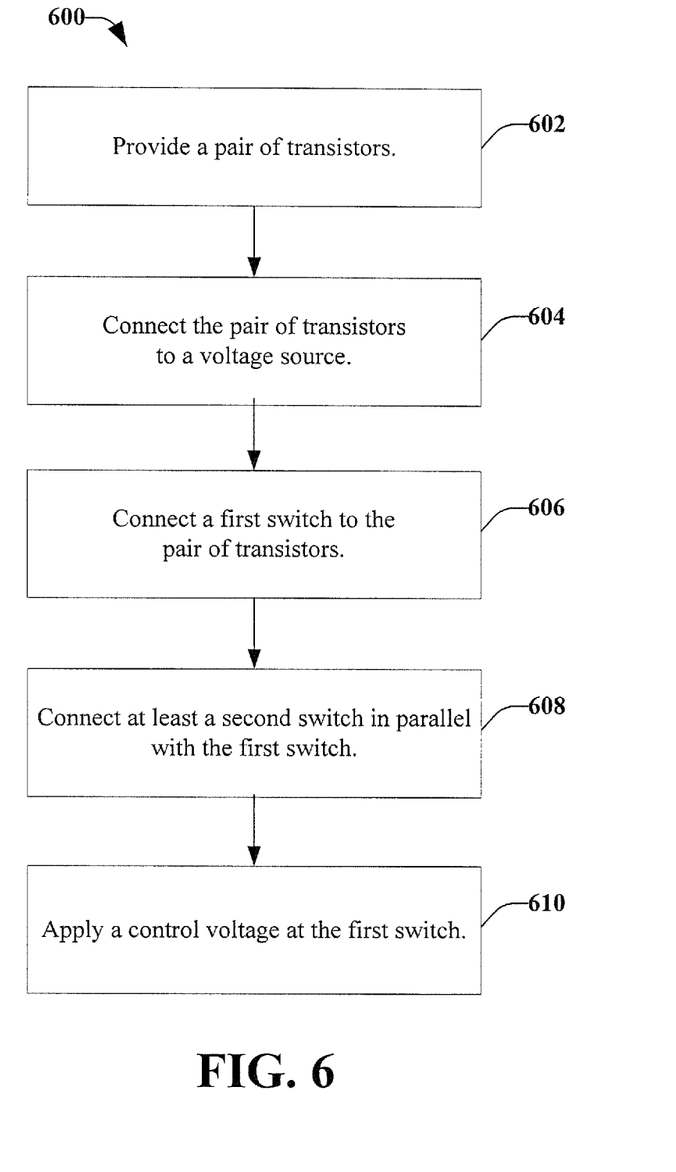
FIG. 6 illustrates another example, non-limiting method for amplifying an input signal, according to an aspect.

FIG. 6 illustrates another example, non-limiting method 600 for amplifying an input signal, according to an aspect. At 602, a pair of transistors are provided. The pair of transistors can be the first transistor 114 and the second transistor 116, both of FIG. 1, for example. At 604, the pair of transistors are connected to a voltage source VDD. For example, the pair of transistors can be connected to the voltage source VDD through respective load resistors.

At 604, first and second current sources are connected to the pair of transistors. A first switch is connected to the pair of transistors, at 606. Further, at 608, at least a second switch is connected in parallel with the first switch. According to an implementation, the first switch, second switch, and subsequent switches can be MOS switches. According to another implementation the first switch, second switch, and subsequent switches can be transistors configured to operate as electrically controlled switches.

At 610, a control voltage is applied to at least the first switch. The control voltage can be configured to control an output voltage of the programmable gain amplifier in stages utilizing a scaled replica of the programmable gain amplifier and a feedback circuit.

According to an implementation, the second switch is closed when the first switch is connected to the control voltage. According to another implementation, the second switch is operable to increase a gain of the first switch by an incremental value.

According to a further implementation, a third switch (and subsequent switches) can be connected in parallel with the first switch and the second switch. The third switch (and subsequent switches) can be closed when the second switch is connected to the control voltage.

Figure 7:
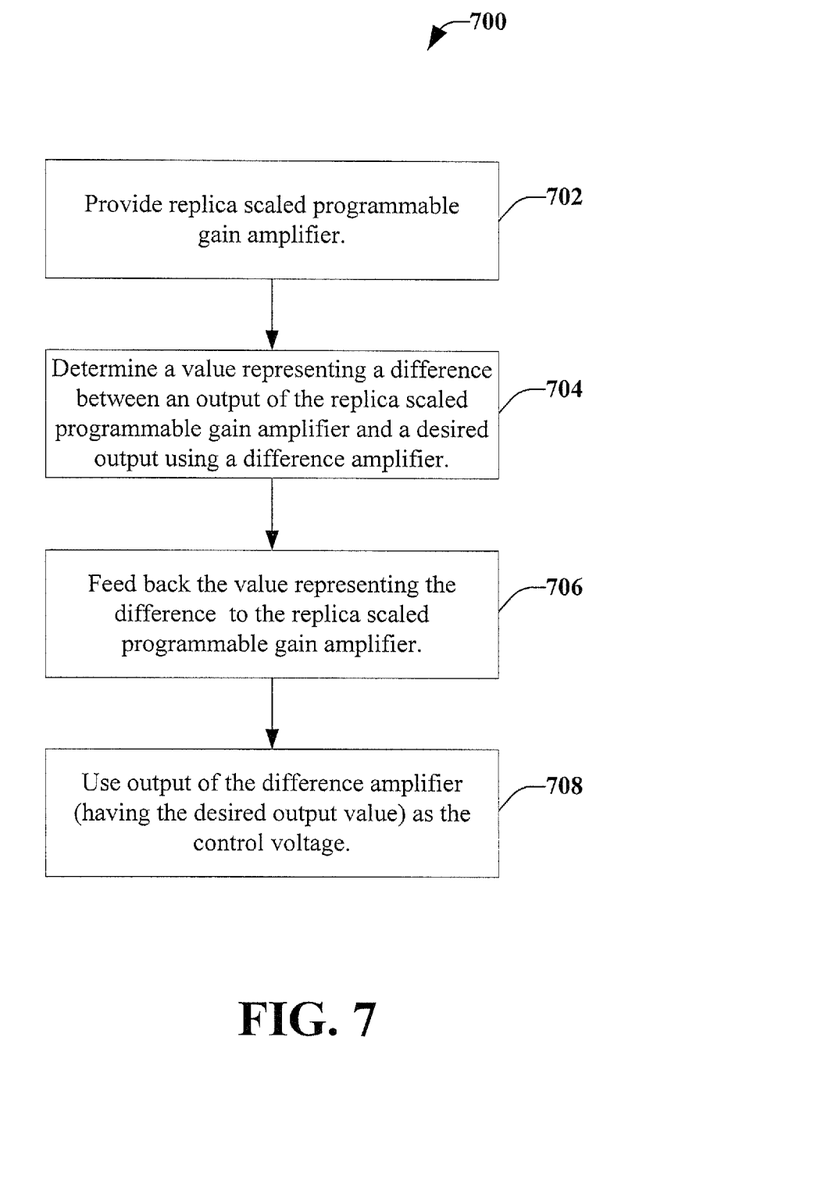
FIG. 7 illustrates an example, non-limiting method for controlling gain steps of a programmable gain amplifier, according to an aspect.

FIG. 7 illustrates an example, non-limiting method 700 for controlling gain steps of a programmable gain amplifier, according to an aspect. At 702, a replica programmable gain amplifier is provided. The replica programmable gain amplifier can be a scaled (e.g., smaller) version of a programmable gain amplifier that is used in an integrated circuit, for example. The replica programmable gain amplifier can be sized accordingly and is not limited to any particular scaling ratio.

At 704, a value representing a difference between an output of the replica programmable gain amplifier and a desired output is determined by a difference amplifier. At 706, the value representing the difference is provided to the replica programmable gain amplifier through a feedback circuit.

At 708, an output of the difference amplifier (having the desired output value) is used as the control voltage used, for example, in method 500 of FIG. 5 and method 600 of FIG. 6.

Figure 8:
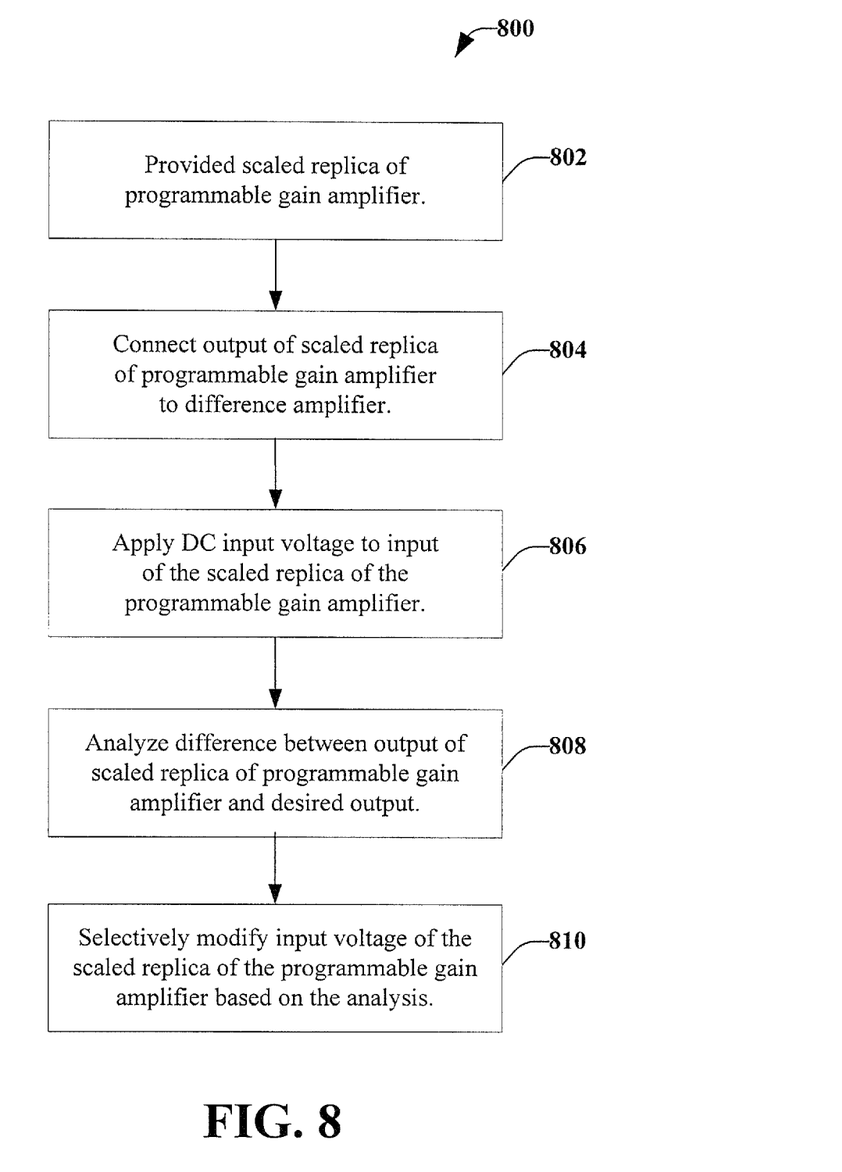
FIG. 8 illustrates another example, non-limiting method for controlling gain steps of a programmable gain amplifier, according to an aspect.

FIG. 8 illustrates another example, non-limiting method 800 for controlling gain steps of a programmable gain amplifier, according to an aspect. At 802, a scaled replica of a programmable gain amplifier is provided. An output of the scaled replica of the programmable gain amplifier is connected to a difference amplifier, at 804.

At 806, a direct current (DC) input voltage is applied to the scaled replica of the programmable gain amplifier. The DC input voltage can be a scaled value of the DC input voltage of the programmable gain amplifier. For example the DC input voltage can be a predetermined voltage (represented as $\Delta V$) divided by the required gain of the programmable gain amplifier.

A difference between the output of the scaled replica of the programmable gain amplifier and the desired output is analyzed (e.g., by a difference amplifier), at 808. Based on the difference, an input voltage of the scaled replica of the programmable gain amplifier is selectively modified, at 810.

The modification at 810 can include supplying a control voltage to an input port of the scaled replica of the programmable gain amplifier through a feedback loop between the difference amplifier and the scaled replica of the programmable gain amplifier.

According to an implementation, the modification at 810 can include supplying the difference information to the scaled replica of the programmable gain amplifier and increasing an input voltage of the scaled replica by an expansion unit per iteration for at least one iteration. In accordance with another implementation, the modification at 810 can include supplying the difference information to the scaled replica of the programmable gain amplifier and decreasing the input voltage of the scaled replica by a reduction unit per iteration for at least one iteration.

It is noted that monitoring the output of the replica programmable gain amplifier can be recursive such that any changes to the output are compared to the desired output and modifications can be dynamically applied. In such a manner, the programmable gain amplifier can be controlled in real-time as process, voltage, and/or temperature variations are experienced by the programmable gain amplifier.

Figure 9:
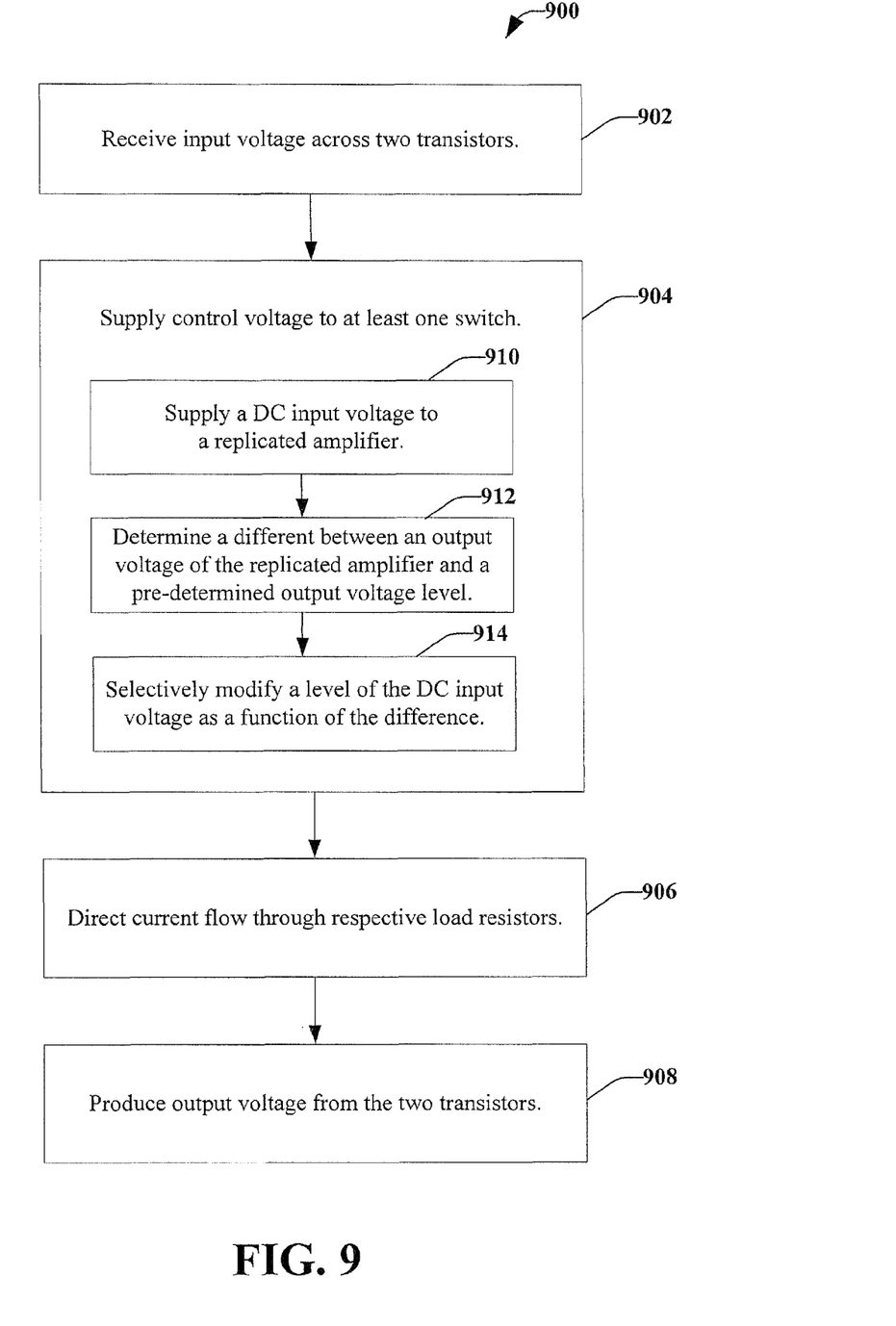
FIG. 9 illustrates a method of processing an input signal to an output signal, according to an aspect.

FIG. 9 illustrates a method 900 of processing an input signal to an output signal, according to an aspect. At 902, an input voltage is received across two transistors. Respective input ports of the two transistors can be connected to a supply voltage through respective load resistors.

At 904, a control voltage is supplied to at least one switch connected to output ports of the two transistors. The control voltage can be supplied by a feedback circuit. At 906, current flow is directed through the respective load resistors based on the input signal and the control voltage to form the output signal at input ports of the two transistors. An output voltage is produced from the two transistors, at 908.

According to an implementation, supplying the control voltage at 904 can include supplying a direct current (DC) input voltage to the replicated amplifier, at 910. The DC input voltage can be a pre-determined voltage divided by the required gain of the programmable gain amplifier. At 912, a difference between an output voltage of the replicated amplifier and pre-determined (e.g., desired) output voltage level is determined. The difference can be represented as a difference value, according to an aspect. At 914, a level of the direct current input voltage supplied to the replicated amplifier is selectively modified as a function of the difference. For example, if the output is determined to be too high, the direct current input voltage can be dynamically reduced. In another example, if the output is determined to be too low, the direct current input voltage can be dynamically increased.

According to an implementation, selectively modifying the level of the DC input voltage at 914 can include adding a voltage comprising a reduction unit or an expansion unit to the direct current input voltage supplied to the replicated amplifier to produce a modified direct current input voltage. Another difference between another output voltage of the replicated amplifier and the pre-determined output voltage level can be determined and another level of the modified direct current input voltage supplied to the replicated amplifier can be selectively adjusted.

Reference throughout this specification to "one embodiment", "an embodiment", "a disclosed aspect", or "an aspect" means that a particular feature, structure, or characteristic described in connection with the embodiment or aspect is included in at least one embodiment or aspect of the present disclosure. Thus, the appearances of the phrase "in one embodiment", "in one aspect", or "in an embodiment" in various places throughout this specification are not necessarily all referring to the same embodiment. Furthermore, the particular features, structures, or characteristics may be combined in any suitable manner in various disclosed embodiments.

As utilized herein, terms "component", "system", "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, and so on) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. In an example, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

Other than where otherwise indicated, all numbers, values and/or expressions referring to quantities of items such as memory size, etc., used in the specification and claims are to be understood as modified in all instances by the term "about."

What is claimed is:

1. An apparatus, comprising:
a programmable gain amplifier, comprising:
a first transistor comprising a first control port, a first input port, and a first output port,
a second transistor comprising a second control port, a second input port, and a second output port,
a resistor comprising a first end connected to the first output port and a second end connected to the second output port, and
at least a third transistor connected to the first output port and the second output port, in parallel with the resistor, wherein on applying a control voltage to the third transistor, and applying an input voltage to the first control port, the second control port is selectively modified by the control voltage to produce a specified output at the first input port and the second input pot;
a replica programmable gain amplifier comprising a scaled version of the programmable gain amplifier, wherein the replica programmable gain amplifier produces an output voltage based on a direct current input voltage that is applied to an input of the replica programmable gain amplifier, and the direct current input voltage being determined as a function of a pre-determined delta voltage divided by a defined gain of the programmable gain amplifier; and
a difference amplifier that is connected to the replica programmable gain amplifier and a voltage source, wherein the replica programmable gain amplifier provides the output voltage to a first input of the difference amplifier and the voltage source provides a pre-determined output voltage to a second input of the difference amplifier, the difference amplifier being configured to determine a value representative of a difference between the output voltage of the replica programmable gain amplifier and the pre-determined output voltage to produce the control voltage as an output of the difference amplifier.

2. The apparatus of claim 1, further comprising:
at least a fourth transistor, connected in parallel with the third transistor and the resistor.

3. The apparatus of claim 2, wherein the fourth transistor comprises an electrically controlled switch that is closed when the third transistor is connected to the control voltage.

4. The apparatus of claim 2, wherein the fourth transistor is operable to increase a gain of the third transistor by an incremental value.

5. The apparatus of claim 2, further comprising:
at least a fifth transistor connected in parallel with the fourth transistor.

6. The apparatus of claim 5, wherein the fifth transistor comprises an electrically controlled switch that is closed when the fourth transistor is connected to the control voltage.

7. The apparatus of claim 1, wherein the control voltage is supplied to an input port of the replica programmable gain amplifier through a feedback loop between the difference amplifier and the replica programmable gain amplifier.

8. The apparatus of claim 1, wherein the value representative of the difference is supplied to the replica programmable gain amplifier, and the direct current input voltage supplied to the replica programmable gain amplifier is increased by an expansion unit per iteration for at least one iteration.

9. The apparatus of claim 1, wherein the value representative of the difference is supplied to the replica programmable gain amplifier, and the direct current input voltage of the replica programmable gain amplifier is decreased by a reduction unit per iteration for at least one iteration.

10. The apparatus of claim 9, wherein the at least one iteration comprises a first iteration of applying the direct current input voltage to the input of the replica programmable gain amplifier and a second iteration applying the direct current input voltage to the input of the replica programmable gain amplifier, and an incremental value of the reduction unit is adjusted from a first incremental value to a second incremental value based on an amount of change in the output voltage between the first iteration and the second iteration.

11. An integrated circuit, comprising:
an amplifier for producing an output signal at an amplifier output based on an input signal received at an amplifier input, wherein the amplifier comprises:
a first transistor comprising a first control port, a first input port, and a first output port,
a second transistor comprising a second control port, a second input port, and a second output port, wherein the first control port and the second control port comprise the amplifier input, and the first input port and the second input port comprise the amplifier output,
a first switch connect to the first output port and the second output port, wherein a control voltage applied to the first switch selectively controls an output of the amplifier; and
a feedback circuit that supplies the control voltage, wherein the feedback circuit comprises:
a replica amplifier configured as a scaled version of the amplifier, wherein the replica amplifier generates an output voltage based on an input voltage that is applied to an input of the replica amplifier, and the input voltage being determined as a function of a pre-determined delta voltage and a defined gain of the amplifier, and
a difference amplifier that is connected to the replica amplifier and a voltage source, wherein the replica amplifier supplies the output voltage to a first input of the difference amplifier and the voltage source supplies a pre-determined output voltage to a second input of the difference amplifier, the difference amplifier being configured to determine a value representing a difference between the output voltage of the replica amplifier and the pre-determined output voltage, and wherein an output of the difference amplifier comprises the control voltage.

12. The integrated circuit of claim 11, wherein the control voltage is supplied to the replica amplifier through a feedback loop between the difference amplifier and the replica amplifier.

13. The integrated circuit of claim 11, wherein the value representing the difference is supplied to the replica amplifier, and the input voltage of the replica amplifier is increased by an expansion unit per iteration for at least one iteration.

14. The integrated circuit of claim 11, wherein the value representing the difference is supplied to the replica amplifier, and the input voltage of the replica amplifier is decreased by a reduction unit per iteration for at least one iteration.

15. The integrated circuit of claim 11, wherein the amplifier comprises at least a second switch connected in parallel with the first switch.

16. The integrated circuit of claim 15, wherein the second switch is turned off when the control voltage is applied to the first switch.

17. The integrated circuit of claim 15, wherein the second switch is turned on when the control voltage is applied to the first switch and the second switch.

18. A method of processing an input signal to an output signal, comprising:
receiving an input voltage across two transistors, wherein respective input ports of the two transistors are connected to a supply voltage through respective load resistors;
supplying a control voltage to at least one switch connected to output ports of the two transistors, wherein the control voltage is supplied by a feedback circuit; directing current flow through the respective load resistors based on the input signal and the control voltage to form the output signal at the input ports of the two transistors;
supplying a direct current input voltage to an input of a replicated amplifier to produce an output voltage based on the direct current input voltage that is applied to the input of the replicated amplifier, wherein the direct current input voltage is determined as a function of a pre-determined delta voltage divided by a defined gain of a programmable gain amplifier; and
determining the control voltage based on a difference between the output voltage of the replicated amplifier and a pre-determined output voltage.

19. The method of claim 18, wherein supplying the control voltage comprises:
determining the difference between the output voltage of the replicated amplifier and the pre-determined output voltage level; and
selectively modifying a level of the direct current input voltage supplied to the replicated amplifier as a function of the difference.

20. The method of claim 19, wherein the selectively modifying the level of the direct current input voltage comprises:
adding a voltage comprising a reduction unit or an expansion unit to the direct current input voltage supplied to the replicated amplifier to produce a modified direct current input voltage;
determining another difference between another output voltage of the replicated amplifier and the pre-determined output voltage level; and
selectively adjusting another level of the modified direct current input voltage supplied to the replicated amplifier.

* * * * *